United States Patent
Kadota et al.

(10) Patent No.: US 6,733,895 B2
(45) Date of Patent: May 11, 2004

(54) ZNO FILM, METHOD FOR MANUFACTURING THE SAME, AND LUMINESCENT ELEMENT INCLUDING THE SAME

(75) Inventors: Michio Kadota, Kyoto (JP); Toshinori Miura, Kyoto (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 10/234,137

(22) Filed: Sep. 5, 2002

(65) Prior Publication Data

US 2003/0064541 A1 Apr. 3, 2003

(30) Foreign Application Priority Data

Sep. 28, 2001 (JP) ........................ 2001-302673

(51) Int. Cl.⁷ .................... B32B 15/04; B32B 9/00
(52) U.S. Cl. ............. 428/469; 428/689; 428/697; 428/701; 428/702
(58) Field of Search ................. 428/689, 697, 428/701, 469

(56) References Cited

U.S. PATENT DOCUMENTS

| | | | | |
|---|---|---|---|---|
| 5,532,062 A | * | 7/1996 | Miyazaki et al. | 428/432 |
| 6,448,585 B1 | * | 9/2002 | Kadota | 257/103 |
| 6,458,673 B1 | * | 10/2002 | Cheung | 438/479 |
| 6,569,548 B2 | * | 5/2003 | Yamamoto et al. | 428/702 |
| 2002/0060324 A1 | | 5/2002 | Kadota | |

FOREIGN PATENT DOCUMENTS

| | | | | |
|---|---|---|---|---|
| EP | 1030378 | | 8/2000 | |
| EP | 1041644 A2 | * | 10/2000 | H01L/31/0224 |
| JP | 07106615 A | * | 4/1995 | H01L/31/04 |
| JP | 1129640 | | 10/1999 | |
| JP | 2000276943 A | * | 10/2000 | H01B/1/08 |
| JP | 2002105625 | | 4/2002 | |

\* cited by examiner

Primary Examiner—Stephen Stein
(74) Attorney, Agent, or Firm—Dickstein, Shapiro, Morin & Oshinsky, LLP

(57) ABSTRACT

A p-type ZnO film is formed on a sapphire substrate by RF magnetron sputtering in an atmosphere of a mixture of Ar and $N_2$ gases, using a Zn metal target doped with $Y_2O_3$. The p-type ZnO film can be easily formed even on a large-sized substrate.

14 Claims, 4 Drawing Sheets

ZNO FILM, METHOD FOR MANUFACTURING THE SAME, AND LUMINESCENT ELEMENT INCLUDING THE SAME

BACKGROUND OF THE INVENTION

1. Field of the Invention

The present invention relates to ZnO films, methods for manufacturing the ZnO films, and luminescent elements. In particular, the present invention relates to a p-type ZnO film, a method for manufacturing the ZnO film, and a luminescent element including the ZnO film.

2. Description of the Related Art

Deposition of a ZnO film on a substrate has been studied for blue light-emitting diodes, solar cells, and the like. ZnO generally exhibits n-type conductivity as a result of adding a dopant such as Al. In order to form the pn junction, a p-type ZnO film is also necessary. However, it is difficult to form a p-type ZnO film.

A method for forming a p-type ZnO film is disclosed in a literature entitled "p-Type Electrical Conduction in ZnO Thin Films by Ga and N Co doping" (Japan J. Appl. Phys., Vol. 38 (1999) pp. L1205–1207). In this method, a ZnO film is deposited on a glass substrate using a ZnO target doped with Ga while the inside of the vacuum chamber employed is maintained under an atmosphere of nitrogen gas, and the film is exposed to an excimer laser beam to form a p-type ZnO film by laser ablation.

However, a laser beam having a small spot size is used in the laser ablation process. Therefore, when a film is deposited on a substrate having a large diameter, the scanning length and the scanning time of the laser beam become very large. Accordingly, it takes a long time to cover the substrate with the film and the cost increases. Therefore it is difficult to put this method into practical use.

SUMMARY OF THE INVENTION

Accordingly, one object of the present invention is to provide a ZnO film having p-type conductivity and which can be easily formed on a large substrate, to provide a method for manufacturing the ZnO film, and to provide a luminescent element having the p-type ZnO film.

In order to overcome the problems described above, the present invention provides a ZnO film comprising ZnO as main material doped with a Group III element and a Group V element according to one preferred embodiment of the present invention. By doping with a Group III element and a Group V element to the film which mainly containing ZnO, a p-type ZnO film can be formed without performing laser ablation. Specifically, the p-type ZnO film of the present invention can be formed on a substrate by sputtering, ECR sputtering, CVD, MOCVD or MBE, and therefore, it can be formed at a speed higher speed than that of laser ablation and at low cost. Thus, the industrial productivity of p-type ZnO films can be increased.

The Group III element may be selected from the group consisting of Sc, Y, La, Ac, B, Al, Ga, In, Tl, lanthanides and actinides, and the Group V element may be selected from the group consisting of N, V, Nb, Ta, P, As, Sb and Bi. Preferably, the content of the Group III element is in the range of about 0.5% to 8% by weight and the content of the Group V element is in the range of about 1% to 16% by weight. Preferably, the content of the Group V element is higher than the content of the Group III element.

According to a methodological aspect, the present invention provides a method for manufacturing a ZnO film. The method includes the steps of: doping a material mainly containing Zn or ZnO with a Group III element and a Group V element to form a target; and depositing a ZnO film on a substrate using the target. The present invention is also directed to another method for manufacturing a ZnO film which method includes the steps of: doping a material mainly containing Zn or ZnO with a Group III element to form a target; depositing a ZnO film on a substrate using the target; and implanting Group V ions into the ZnO film. The Group III element and the Group V element may be contained in compounds, and specifically in oxides.

According to another preferred embodiment of the present invention, the present invention provides a ZnO film doped with a Group I element and a Group VII element and the film mainly contains ZnO. Preferably, the content of the Group I element is in the range of about 0.5% to 8% by weight and the content of the Group VII element is in the range of about 1% to 16% by weight. More, preferably, the content of the Group I element is about 0.5% to 7.5% and the content of the Group VII element is about 1 to 15%. Preferably, the content of the Group I element is higher than the content of the Group VII element. By doping a film mainly containing ZnO with a Group I element and a Group VII element such that the content of the Group I element is higher than that of the Group VII element, a p-type ZnO film can be formed without performing laser ablation. Specifically, the p-type ZnO film of the present invention can be formed on a substrate by sputtering, ECR sputtering, CVD, MOCVD or MBE, and therefore, it can be formed at a speed higher speed than that of laser ablation and at low cost. Thus, the industrial productivity of p-type ZnO films can be increased.

The ZnO film can be applied to luminescent elements, such as blue light-emitting diodes. By using the p-type ZnO film of the present invention to increase the manufacturing speed of the luminescent elements, mass productivity can be increased.

DETAILED DESCRIPTION OF THE PREFERRED EMBODIMENTS

The ZnO Film

First Example

First, Zn, which is a constituent of a metal target, was doped with 1 to 6% by weight of $Y_2O_3$ to form Zn metal target. Each Zn metal target was put into a target holder in a sputtering apparatus and a sapphire substrate was placed in the sputtering apparatus. Next, a ZnO film was deposited to a thickness of 1 $\mu$m on the sapphire substrate by RF magnetron sputtering under the following conditions.

Gas: mixture of Ar and $N_2$ gases

Gas flow ratio: $Ar:O_2:N_2=25:10:5$

Gas pressure: $1\times10^{-2}$ Torr

Substrate temperature: 200° C.

Thus, a p-type ZnO film doped with the Group III element Y and the Group V element N was formed on the sapphire substrate. In particular, a Zn metal target doped with 4% by weight of $Y_2O_3$ resulted in an excellent ZnO film.

Figure 1:
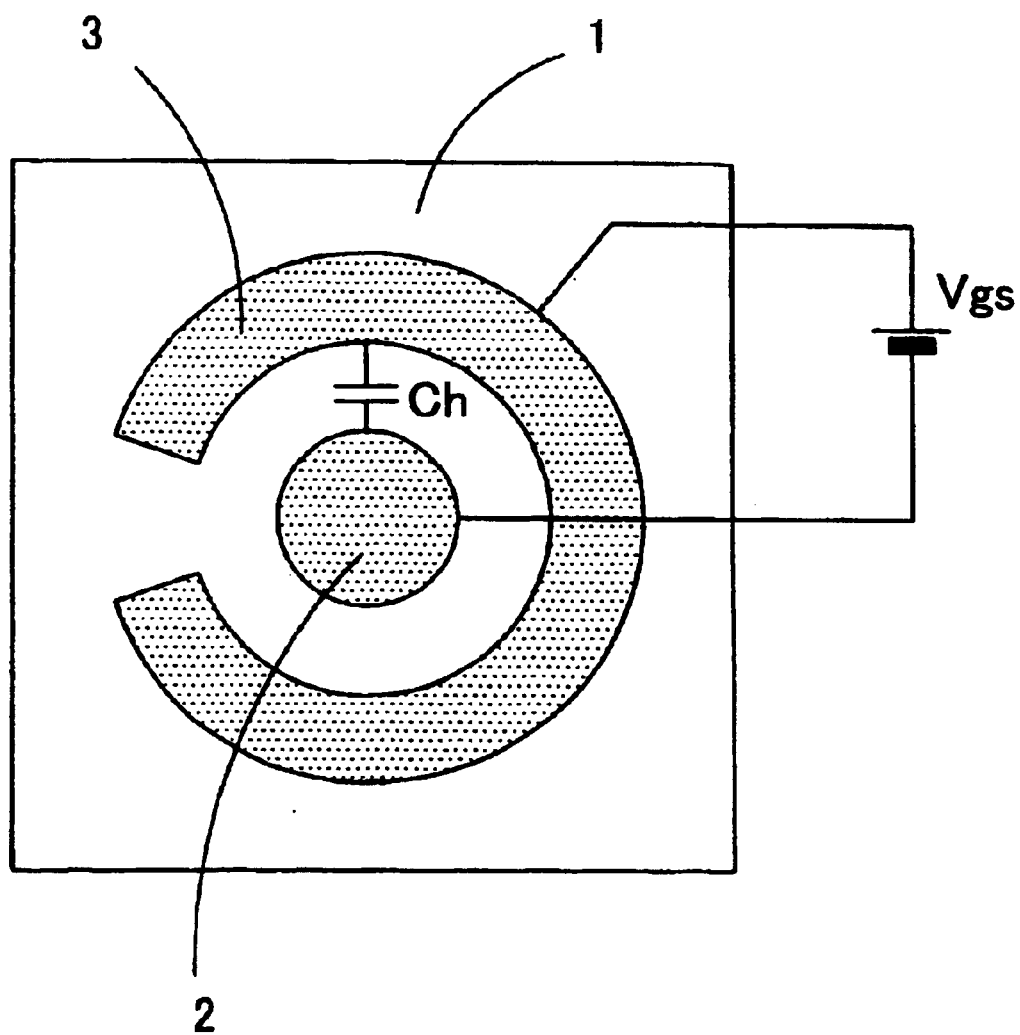
FIG. 1 is a schematic illustration of a system for investigating the capacitance-voltage characteristics of a ZnO film.

The conductivity type of ZnO films was determined through investigating the capacitance-voltage characteristics (hereinafter referred to as CV characteristics). As shown in FIG. 1, the CV characteristics were obtained by measuring the voltage Vgs and capacitance Ch between a circular electrode 2 and a C-shaped electrode 3 which were formed on the surface of a measured object (ZnO film) 1. When the measured object 1 has p-type conductivity, the capacitance-voltage curve slopes down to the right where the horizontal axis and the vertical axis represent the voltage Vgs and the capacitance Ch between the electrodes, respectively; when it has n-type conductivity, the curve slopes up to the right. By obtaining the CV characteristics, the conductivity type of measured objects 1 can be determined.

Zn, which is a constituent of a metal target, was doped with 1 to 6% by weight of the Group III (Sc, Y, La, Al, Ga and the like) to form Zn or ZnO target. A ZnO film is formed on the substrate using the Zn metal target or ZnO ceramic target. The ZnO film is doped with a content of the Group III in the range of about 0.5% to 8% by weight.

Figure 2:
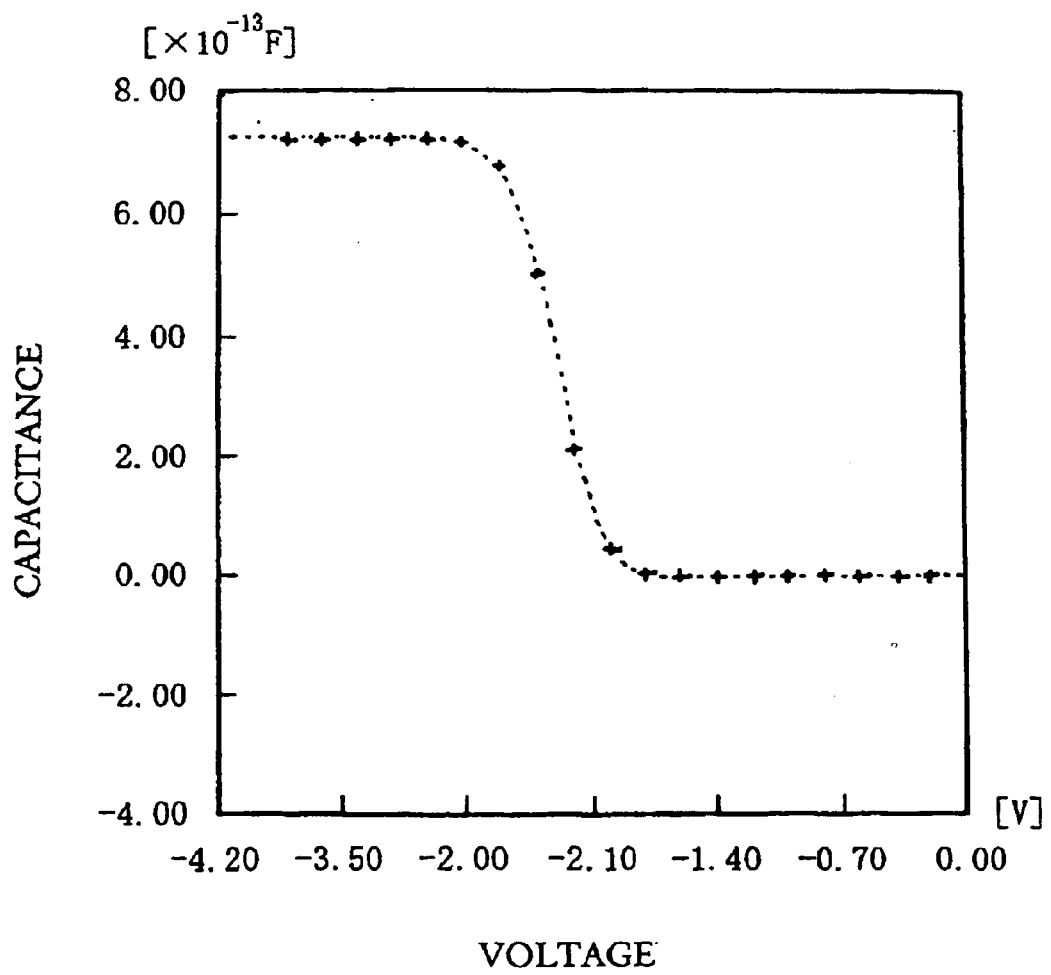
FIG. 2 is a graph showing the capacitor-voltage characteristics of a ZnO film doped with Y and N.
Figure 3:
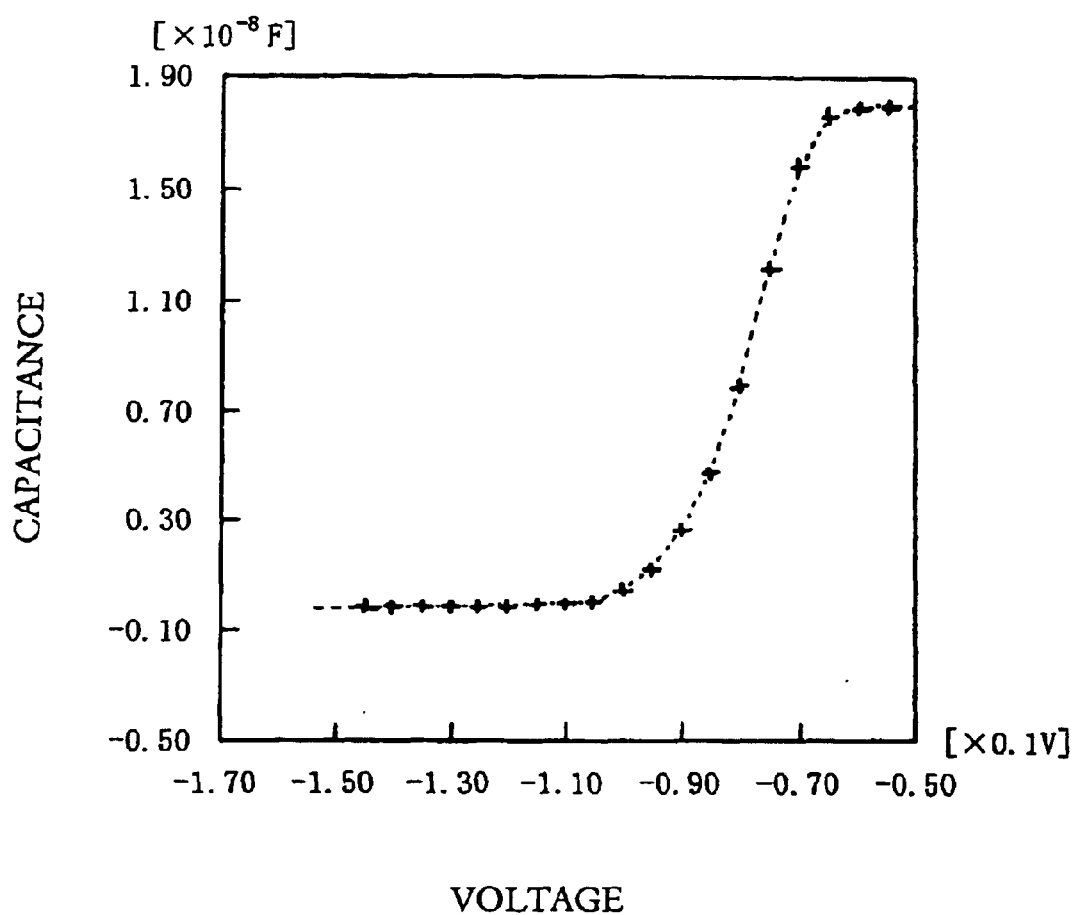
FIG. 3 is a graph showing the capacitor-voltage characteristics of a ZnO film doped with Al.

FIG. 2 shows the CV characteristics of a measured object (the ZnO film doped with Y and N) according to the first example. The horizontal axis and the vertical axis of the graph represent the voltage Vgs between the electrodes and the capacitance Ch, respectively. As shown in FIG. 2, the capacitance-voltage curve of the ZnO film slopes down to the right and, therefore, the ZnO film is determined as p-type. By contrast, a ZnO film doped with Al exhibits a capacitance-voltage curve sloping up to the right, as shown in FIG. 3, and is, therefore, determined as n-type.

Second Example

First, Zn, which is a constituent of a metal target, was doped with 1% by weight of Ga and 2% by weight of Bi to form a Zn metal target. The Zn metal target was put into a target holder in a sputtering apparatus and a sapphire substrate was placed in the sputtering apparatus. Next, a ZnO film was deposited to a thickness of 1 μm on the sapphire substrate by RF magnetron sputtering under the following conditions.

Gas: mixture of Ar and $O_2$ gases
　　Gas flow ratio: Ar:$O_2$=50:50
　　Gas pressure: $1\times10^{-2}$ Torr
　　Substrate temperature: 200° C.

Thus, a p-type ZnO film doped with the Group III element Ga and the Group V element Bi was formed on the sapphire substrate. The ZnO film had a specific resistance of 0.1·cm or less.

As in the same manner, ZnO films doped with various amounts of Ga and Bi were formed. As a result, Zn metal target or ZnO ceramic target doped with 1% to 10% by weight of Ga and 2% to 20% by weight of Bi (wherein, Ga content>Bi content) resulted in excellent p-type ZnO films.

Also, Zn metal target or ZnO ceramic target doped with other combinations of a Group III element and a Group V element, such as Al and Nb, resulted in p-type ZnO films.

Zn, which is a constituent of a metal target, was doped with 1 to 6% by weight of the Group III (Sc, Y, La Al, Ga and the like) and 1 to 20% by weight of the Group V (N, V, Nb, P, As and the like) to form Zn metal target or ZnO ceramic target. And ZnO film is formed on the substrate using the Zn metal target or ZnO ceramic target. ZnO film is doped with the content of the Group III in the range of about 0.5% to 8% by weight and the content of the Group V in the range of about 1% to 16% by weight.

Third Example

A metal target doped with a Group III element may be used to deposit a ZnO film, and the ZnO film is subsequently doped with Group V ions by implantation. For example, Zn was doped with Ga to form a Zn metal target. A ZnO film was deposited using the Zn metal target on a sapphire substrate by RF magnetron sputtering. Then, the ZnO film was doped with As ions at about 1015 $cm^{-2}$ by implantation and, thus, a p-type ZnO film was formed.

The above-described ZnO films were formed by sputtering (RF magnetron sputtering), but they may be formed by molecular beam epitaxy (MBE), metal-organic chemical vapor deposition (MOCVD) or chemical vapor deposition (CVD).

Fourth Example

When a ZnO film was doped with at least one element selected from the group consisting of Li, Na, K, Rb, Cu, Ag and Au, which belong to Group I, and at least one element selected from the group consisting of Mn, Tc, Re, F, Cl, Br, I and At, which belong to Group VII, the resulting ZnO film also exhibited p-type conductivity. Specifically, Zn, which is a constituent of a metal target, was doped with 2% by weight of Cu and 1% by weight of Mn to form a Zn metal target. The Zn metal target was put into a target holder in a sputtering apparatus and a sapphire substrate was placed in the sputtering apparatus. Next, a ZnO film was deposited to a thickness of 1 μm on the sapphire substrate by RF magnetron sputtering under the following conditions.

Gas: mixture of Ar and $O_2$ gases
　　Gas flow ratio: Ar:$O_2$=50:50
　　Gas pressure: $1\times10^{-2}$ Torr
　　Substrate temperature: 200° C.

Thus, a p-type ZnO film doped with the Group I element Cu and the Group VII element Mn was formed on the sapphire substrate. Preferably, the content of the Group I element is more higher than that of the Group VII element.

When a Group I element and a Group VII element are used as dopants, a Zn metal target or ZnO ceramic target doped with a Group I metal or molecule may also be used to form a ZnO film and, then, Group VII ions are implanted into the ZnO film. For example, Zn was doped with Cu to form a Zn metal target or ZnO ceramic target. A ZnO film was deposited on a sapphire substrate using the Zn metal target by RF magnetron sputtering. Then, the ZnO film was doped with Br ions at about 1016 $cm^{-2}$ by implantation and, thus, a p-type ZnO film was formed.

Usually, amounts of the dopants in the ZnO film are smaller than that of the dopants in the target, between half and 90% of the amounts of the dopants in the metal target.

The Luminescent Element

Figure 4:
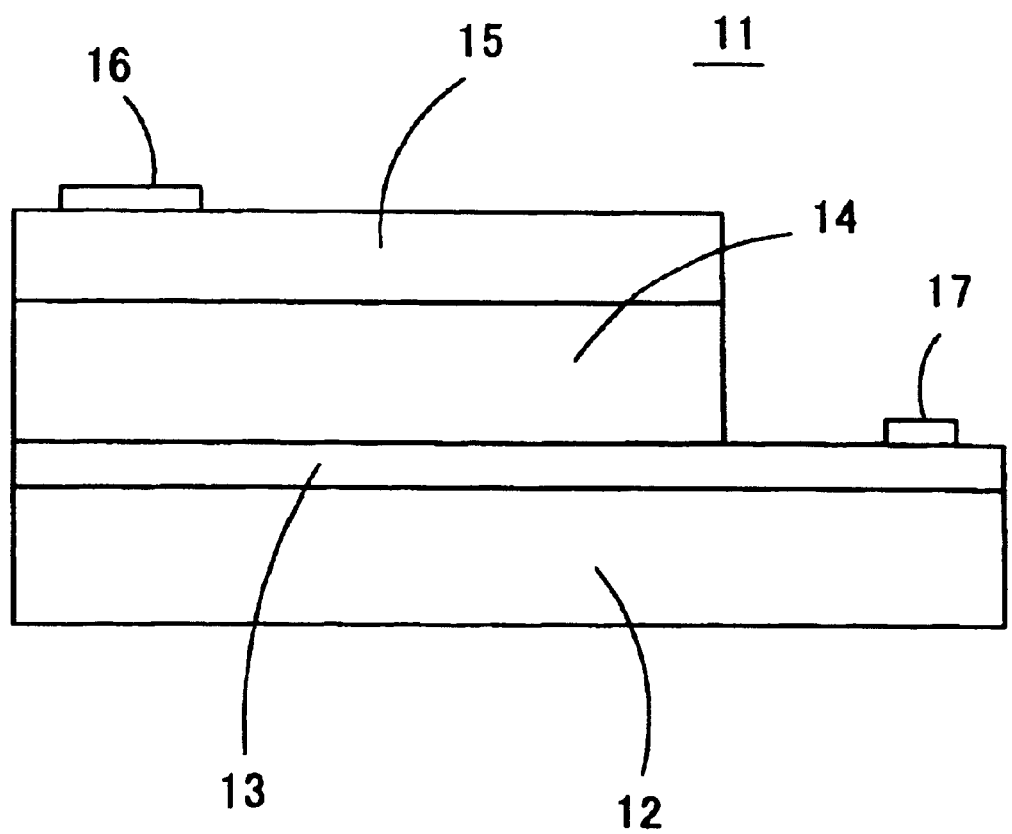
FIG. 4 is a sectional view of a luminescent element according to an embodiment of the present invention.

FIG. 4 is a sectional view of a luminescent element 11 of the present invention. The luminescent element 11 has a c-plane sapphire substrate 12. A metallic layer 13 and a p-type ZnO film (thin film) 14 are deposited, in that order, on the c-plane sapphire substrate 12. The ZnO film 14 is doped with a group III metal and a Group V metal in accordance with the method of the present invention and, thus, exhibits p-type conductivity. The luminescent element 11 also has an n-type ZnO film (thin film) 15 doped with Al on the p-type ZnO film 14. An upper electrode 16 and a lower electrode 17 are disposed on the upper surface of the n-type ZnO film 15 and the upper surface of the metallic layer 13, respectively.

When a voltage is applied between the upper electrode 16 and the lower electrode 17, light emitted between the p-type ZnO film 14 and the n-type ZnO film 15 travels to the outside through the n-type ZnO film 15.

While preferred embodiments of the present invention have been described above, it is to be understood that variations and modifications will be apparent to those skilled in the art without departing the scope and spirit of the invention. The scope of the invention, therefore, is to be determined solely by the following claims.

What is claimed is:

1. A luminescent element comprising a substrate;

a metallic layer;

a p-type ZnO film;

a n-type ZnO film; wherein the p-type ZnO film is doped with (a) a Group III element and (b) a Group V element.

2. A luminescent element according to claim 1, wherein the content of the (a) element is in the range of about 1% to 16% by weight and the content of the (b) element is in the range of about 0.5% to 8% by weight.

3. A luminescent element according to claim 2, wherein the Group III element is selected from the group consisting of Sc, Y, La, Ac, B, Al, Ga, In, Tl, lanthanides and actinides, and the Group V element is selected from the group consisting of N, V, Nb, Ta, P, As, Sb and Bi.

4. A luminescent element according to claim 3, wherein the content of the Group III element is in the range of about 0.5% to 8% by weight and the content of the Group V element is in the range of about 1% to 16% by weight.

5. A luminescent element according to claim 4, wherein the content of the Group V element is higher than the content of the Group III element.

6. A luminescent element according to claim 5, wherein the Group V element is Y or Ga and the Group III element is N, Bi or As.

7. A luminescent element according to claim 2, wherein the content of the Group V element is higher than the content of the Group III element.

8. The luminescent element according to claim 1 wherein the element further comprises an electrode disposed on a surface of the n-type ZnO film distant from the p-type ZnO film and an electrode on a surface of the metallic layer adjacent the p-type ZnO film.

9. The luminescent element according to claim 8 in which the substrate is a sapphire substrate and the n-type ZnO film is doped with Al.

10. The luminescent element according to claim 1 in which the substrate is a sapphire substrate and the n-type ZnO film is doped with Al.

11. The luminescent element according to claim 10, wherein the content of the Group V element is higher than the content of the Group III element.

12. The luminescent element according to claim 10, wherein the content of the Group III element is in the range of about 0.5% to 8% by weight and the content of the Group V element is in the range of about 1% to 16% by weight.

13. The luminescent element according to claim 11, wherein the content of the Group V element is higher than the content of the Group III element.

14. The luminescent element according to claim 12, wherein the Group V element is Y or Ga and the Group III element is N, Bi or As.

* * * * *